(12) United States Patent
Kemper (10) Patent No.: US 8,698,053 B2
(45) Date of Patent: Apr. 15, 2014

(54) METHOD FOR PRODUCING AN ELECTRONIC DEVICE

(75) Inventor: Alfred Kemper, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 653 days.

(21) Appl. No.: 11/828,877

(22) Filed: Jul. 26, 2007

(65) Prior Publication Data

US 2008/0023530 A1  Jan. 31, 2008

(30) Foreign Application Priority Data

Jul. 26, 2006 (DE) .......................... 10 2006 034 600

(51) Int. Cl.
| | | |
|---|---|---|
| H05B 6/10 | (2006.01) | |
| B23K 13/01 | (2006.01) | |
| B23K 1/002 | (2006.01) | |
| B23K 1/00 | (2006.01) | |

(52) U.S. Cl.
CPC ................ B23K 13/01 (2013.01); B23K 1/002 (2013.01); *B23K 1/0016* (2013.01)
USPC ...................... 219/603; 228/179.1; 228/234.1

(58) Field of Classification Search
USPC .................. 219/85.11, 10.41, 10.43, 9.5, 8.5, 219/10.53, 10.71, 10.75, 10.79, 600–677; 228/180.1, 180.2
See application file for complete search history.

(56) References Cited

U.S. PATENT DOCUMENTS

| | | | | |
|---|---|---|---|---|
| 4,983,804 | A * | 1/1991 | Chan et al. ................... | 219/616 |
| 5,341,980 | A * | 8/1994 | Nishikawa et al. ........... | 228/205 |
| 6,229,124 | B1 * | 5/2001 | Trucco .......................... | 219/605 |
| 6,255,002 | B1 * | 7/2001 | Olofsson ....................... | 428/620 |
| 6,271,507 | B2 * | 8/2001 | Godwin ........................ | 219/603 |
| 6,288,376 | B1 * | 9/2001 | Tsumura ....................... | 219/635 |
| 6,649,887 | B2 * | 11/2003 | Budinger ...................... | 219/615 |
| 6,796,483 | B1 * | 9/2004 | Weber et al. .................. | 228/219 |
| 2005/0023275 | A1 * | 2/2005 | Lazaro Gallego ............ | 219/633 |

FOREIGN PATENT DOCUMENTS

| | | |
|---|---|---|
| DE | 2548915 | 5/1977 |
| DE | 261693 A1 | 11/1988 |
| DE | 19809722 | 9/1999 |
| DE | 102004057630 | 3/2006 |

* cited by examiner

*Primary Examiner* — Tu B Hoang
*Assistant Examiner* — Thien S Tran
(74) *Attorney, Agent, or Firm* — Dicke, Billig & Czaja, PLLC (57) ABSTRACT

A method for producing an electronic device is disclosed. One embodiment provides two soldering partners to be connected to one another at an envisaged joining location and at least one of which includes an electronic component or is formed as such a component, a soldering apparatus having an inductor, and an intermediate plate The soldering partners, the inductor and the intermediate plate are positioned in such a way that the intermediate plate is arranged between the electronic component and the envisaged joining location, on the one hand, and the inductor. The soldering partners are connected at the envisaged joining location by using a solder that is melted by energy emitted by the inductor.

24 Claims, 11 Drawing Sheets

METHOD FOR PRODUCING AN ELECTRONIC DEVICE

CROSS-REFERENCE TO RELATED APPLICATIONS

This Utility patent application claims priority to German Patent Application No. DE 10 2006 034 600.9-34 filed on Jul. 26, 2006, which is incorporated herein by reference.

BACKGROUND

The invention relates to a method for producing an integrated circuit, electronic device, or semiconductor device including a soldering connection. In such a method, two soldering partners are connected to one another by using a solder at an envisaged joining location.

Especially for the purpose of soldering electronic components, use is made of installations in which the components and the solder are heated in a chamber. The heating may be effected by using hotplates.

However, the heating of the soldering partners and the solder is effected by contact heat between the hotplate, on the one hand, and the soldering partners and the solder, on the other hand, and also by convection of the atmosphere situated in the chamber.

In order to achieve a specific temporal temperature profile at the material to be soldered, the material to be soldered, in the case of continuously heated hotplates, is supplied with energy in apportioned fashion by repeated docking and undocking of the material to be soldered at the hotplate. Since the hotplates have an increased temperature relative to the soldering temperature, in this way it is possible also to achieve steep temperature ramps at the material to be soldered.

This results in very great temperature jumps momentarily at the material to be soldered, which is reflected in a staircase- or sawtooth-like profile of the temperature at the material to be soldered.

If there is a large difference between the temperature of the hotplate and the temperature of the soldering partners, there is therefore the risk of thermal overshoot at the peak of the temperature profile, whereby they may be heated to an excessively great extent and be destroyed in the extreme case. In order to avoid this disadvantage, a relatively complicated docking and undocking mechanism is required.

A further disadvantage of this method consists in the fact that there is an increased energy consumption as a result of the continuous high level of heating of the hotplates.

In both methods, e.g., during the soldering of populated ceramic substrates onto precurved baseplates for power semiconductor modules, gas convection may be required for heating of the baseplates since, on account of the curvature, there is only poor direct thermal contact between baseplate and hotplate.

Soldering in a gas atmosphere has the disadvantage, however, that gas inclusions in the solder, that is to say the formation of voids, can occur. The volumes of the gas inclusions increase on account of further heating. This can give rise to spraying and to uncontrolled deposits of solder at component parts situated adjacent to the joining location.

Although the formation of voids could be avoided by soldering in a vacuum, in that case gas would no longer be available for convective heat transfer from the hotplate to the baseplate. The baseplate would be heated only via its contact locations with the hotplate, which, however, would result in a greatly nonuniform temperature distribution in the baseplate and hence highly inhomogeneous and qualitatively unsatisfactory soldering connection.

In addition, such a method would be associated with very long heating times since the heat transfer can only take place at the contact locations between the baseplate and the hotplate. Consequently, only very shallow temperature ramps could be produced at the baseplate.

The problem area outlined exists, of course, not only when soldering curved baseplates, but generally when soldering material to be soldered having an uneven surface.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present invention provides a method e.g., for the soldering of curved baseplates of power semiconductor modules to be produced, in which method it is possible to comply with a temperature profile prescribed for the soldering and having high temperature gradients precisely and with a low energy consumption, and in which method an electronic component involved is protected against being destroyed.

A method according to one embodiment involves firstly providing two soldering partners which are to be connected to one another at a prescribed joining location. In the case of the soldering partners to be connected to one another, at least one includes an electronic component or is formed as such a component. By way of example, the soldering partners may be components of a power semiconductor module to be produced.

In addition to the soldering partners, an intermediate plate as well as a soldering apparatus with an inductor are also provided.

The intermediate plate may be either a component of a soldering partner or a component that is independent of the soldering partners. The intermediate plate provides for temperature spreading, that is to say for uniform distribution of the heat.

In this case, the soldering partners, the inductor and the intermediate plate are positioned in such a way that the intermediate plate is arranged between the envisaged joining location and the inductor. In this case, the soldering partners remain spaced apart from the inductor.

The soldering partners are subsequently connected to one another at the joining location by using a solder. For this purpose, the solder is melted by using energy emitted by the inductor.

The inductor generates eddy currents in the intermediate plate, on account of which the intermediate plate is heated such that the solder in thermal contact with it melts.

In order to avoid overheating, the inductor may be cooled by using cooling, e.g., liquid cooling. In this case, a suitable coolant is water, which may also be provided with additives. By virtue of the cooling, the inductor is subjected to significantly less thermal cycling than a conventional hotplate.

After cooling of the solder, a joining location at which the soldering partners are fixedly and permanently connected to one another arises between the soldering partners at the location of the cooled solder.

The intermediate plate arranged between the inductor, on the one hand, and the solder and the envisaged joining location, on the other hand, shields the electronic component from the magnetic field generated in the inductor and thus prevents undesirable heating of the component.

Thus, the heating of the solder and the soldering partners is essentially not effected directly by the inductor, but rather indirectly via the intermediate plate heated by the inductor.

The inductor may be arranged essentially in one plane, the envisaged joining location being spaced apart from the plane.

In order to achieve a sufficient shielding effect, in one embodiment the intermediate plate extends beyond the electronic component in each lateral direction perpendicular to the direction of the normal to the plane.

The intermediate plate may be formed e.g., as a metal plate or as a metallic layer. In general, the intermediate plate is a component which is independent of the soldering partners and which is removed again after the heating of the solder.

In one embodiment, however, the intermediate plate may also be a soldering partner itself or a constituent part that is fixedly connected to one of the soldering partners. In one embodiment, the baseplate of a power semiconductor module shall be mentioned as an example of an intermediate plate which simultaneously constitutes one of the soldering partners.

In a further embodiment, one of the soldering partners may be a ceramic carrier provided with a metallization layer. In this case, the other soldering partner may be a power semiconductor component.

In order to avoid the formation of gas inclusions in the solder and spraying of liquid solder, the soldering partners and the joining location may be arranged in an evacuatable chamber at least during the melting of the solder. The melting of the solder in the evacuatable chamber may be effected in a vacuum at an absolute pressure in the chamber of e.g., 0 hPa-800 hPa, e.g., less than or equal to 10 hPa, or e.g., less than or equal to 1 hPa.

Since the energy fed to the intermediate plate may be adapted very rapidly by using a suitable variation, e.g., by using the current flowing through the inductor being switched on or off, repeated docking and undocking of the material to be soldered at the intermediate plate is obviated. During the melting of the solder, there may be a uniform heat transfer resistance between the intermediate plate and at least one of the soldering partners without overheating of the component occurring.

The electric current required for supplying the inductor is generated by using a generator. By using a control or a regulation of the intensity and/or the frequency of the electric current, it is possible, in a simple manner, to adapt the energy input into the intermediate plate and thus to cover a desired temperature profile.

In the case of the regulation of the intensity and/or the frequency of the electric current, a temperature sensor may be thermally coupled to the intermediate plate or to at least one of the soldering partners which is connected to the generator.

Instead of only one temperature sensor of this type, it is possible, of course, to provide as many temperature sensors as desired which are connected to the generator and which are in thermal contact with the intermediate plate and/or with one of the soldering partners.

Figure 1:
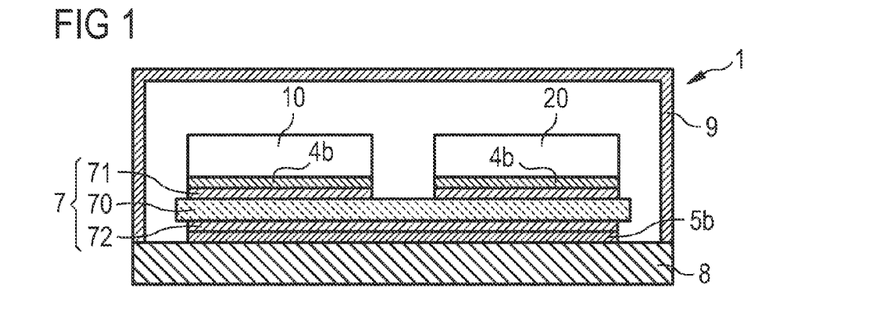
FIG. 1 illustrates a vertical section through a power semiconductor module to be produced by a method according to the invention.

FIG. 1 illustrates a vertical section through a power semiconductor module 1 in which soldering connections formed by solder layers 4b, 5b are to be produced with application of the method according to the invention.

The power semiconductor module 1 has a substrate 7, which includes a ceramic carrier 70 provided with a metallization layer 72 on the underside and with a patterned metallization layer 71 on the top side. Optionally, the metallization layer 72 on the underside may likewise be patterned.

Power semiconductor components 10, 20, for example diodes, IGBTs, MOSFETs or any other components, are soldered onto predetermined portions of the patterned metallization layer 71 by using a solder layer 4.

The ceramic carrier 70, for example composed of aluminum oxide, with the power semiconductor components 10, 20 situated thereon, is soldered onto a metallic plate 8 by using a further solder layer 5b, the metallic plate forming the baseplate of a housing 9 of the power semiconductor module 1. The soldering connections 4b, 5b of this power semiconductor module 1 may be produced in one process or else successively.

In the present mounted state, the underside of the baseplate 8 is planar, with the result that the power semiconductor module 1 may be mounted by the baseplate 8 onto a heat sink with good direct thermal contact.

The substrate 7 is fixedly connected to each of the power semiconductor components 10, 20 and also to the baseplate 8 at any respective joining location. The joining locations include the solder layers 4b and 5b and also those surface regions of the respective soldering partners 10, 20, 7 and 7, 8 which are covered by the solder layers 4b and 5b, respectively.

Figure 2:
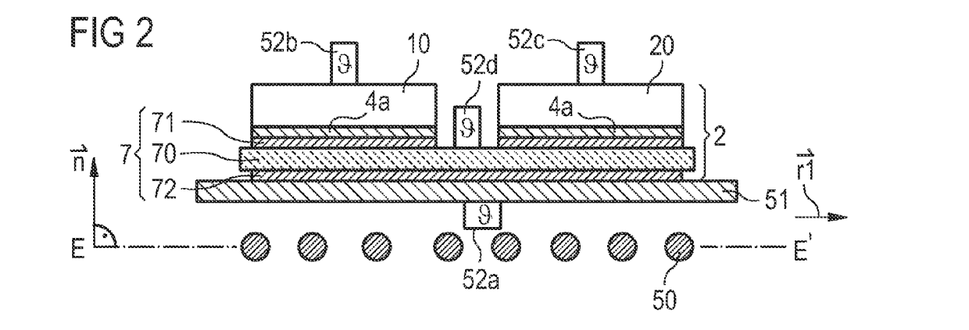
FIGS. 2 to 7 illustrate several processes of the method for producing the power semiconductor module in accordance with FIG. 1.

To produce these connections, referring to FIG. 2, firstly a solder 4a, for example in the form of a soldering paste, is applied to specific portions of the top-side patterned metallization layer 71 of the substrate 7. The power semiconductor components 10, 20 are in turn placed onto the solder 4a.

In order to melt the solder 4a and thereby produce a joining location between the power semiconductor components 10, 20, on the one hand, and the substrate 7, on the other hand, an intermediate plate 51, for example a metallic plate, is provided, which is heated by eddy currents by using an inductor 50.

In this embodiment, the intermediate plate 51 is situated between the power semiconductor components 10, 20, such that the latter are shielded from the inductor 50 by the intermediate plate 51.

The inductor 50 has a number of loops and is arranged essentially in one plane E-E'. At least the power semiconductor components 10, 20, but optionally also the joining location and/or the intermediate plate 51, are spaced apart from the inductor 50 in a direction n of a normal perpendicular to the plane E-E'.

In order to ensure that the power semiconductor components 10, 20 are shielded by the intermediate plate 51, the intermediate plate may extend beyond the electronic component in each lateral direction perpendicular to the direction of the normal, as is illustrated by way of example in respect of the lateral direction r1.

A temperature sensor 52a is furthermore provided, which is in thermal contact with the intermediate plate 51. If an AC current is fed to the inductor 50, then the intermediate plate 51 is heated on account of the eddy currents that form in it. The power semiconductor components 10, 20 and also the solder 4a are in good thermal contact with the intermediate plate 51 via the substrates 7, such that the solder 4a, if current is fed to the inductor 50 for a sufficiently long time and if the current intensity is sufficient, is heated until it finally melts.

By virtue of the low thermal mass of ceramic substrate 7 and semiconductor component in contrast to the intermediate plate, the temperature in the soldering partners is reproducibly lower than the temperature in the intermediate plate 51 only by typically 5° C. In order to ensure this reproducibility even in the case of bent substrates 7 (the bending results from the different thermal expansions of the metallization 71, 72 and the ceramic 70 of the substrates 7), the substrates 7 are pressed onto the intermediate plate 51 during the soldering process.

By using the temperature sensor 52a, it is possible to monitor the temperature of the intermediate plate 51 and as necessary to vary a change in the intensity and/or the duration and/or the frequency of the electric current and thus to cover a predetermined temperature profile.

Figure 3:
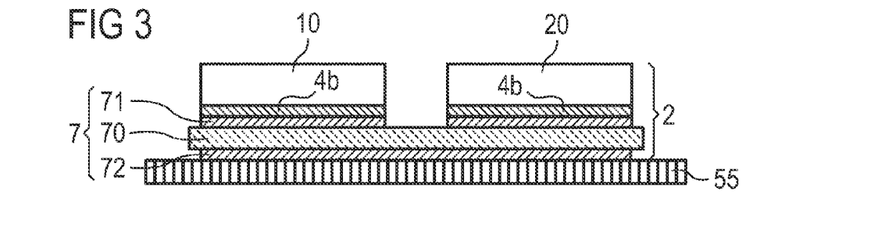

After the solder 4a has liquefied, the substrate 7 with the power semiconductor components 10, 20 situated thereon is placed onto a cooling plate 55, with the result that the heated solder 4a is cooled and solidified solder connections 4b arise at the envisaged joining location, which is illustrated as the result in FIG. 3.

The material to be soldered or the cooling plate 55 may also be cooled, e.g., by a cooling of the inductor 50, for example by liquid cooling.

Figure 4:
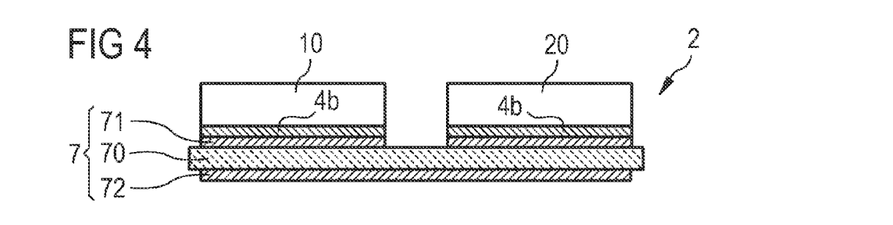

The substrate 7 populated with the power semiconductor components 10, 20 is provided with the reference symbol 2. FIG. 4 illustrates the populated substrate 2 after lift-off from the cooling plate 55 in accordance with FIG. 3.

The solder layer 5b illustrated in FIG. 1 is subsequently produced in accordance with FIG. 1 in a similar manner. The soldering partners that are to be fixedly connected to one another by the solder layer 5b are the baseplate 8 in accordance with FIG. 1 and the populated substrate 2 in accordance with FIG. 4.

Figure 5:
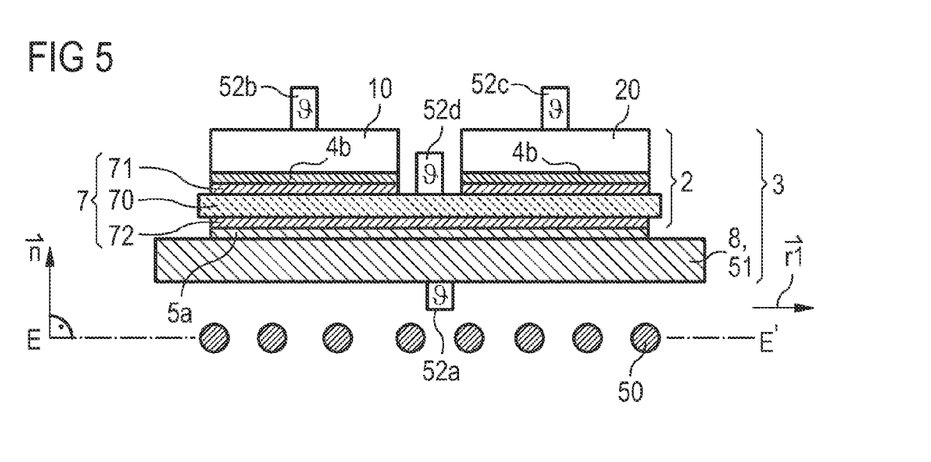

In this embodiment, a solder layer 5a in accordance with FIG. 5 is provided, which is arranged between the substrate 7 of the finished populated substrate 2 in accordance with FIG. 4 and the baseplate 8. The arrangement in accordance with FIG. 5 corresponds to the arrangement in accordance with FIG. 2 with regard to the soldering connection to be produced, in which case, in contrast to the arrangement in accordance with FIG. 2, the intermediate plate 51 is not removed after the soldering operation, but rather constitutes one of the soldering partners in the form of a baseplate 8 of the power semiconductor module to be produced.

In the embodiment in accordance with FIG. 5, too, the intermediate plate 51 is arranged between the power semiconductor components 10, 20 and the inductor 50. Both the power semiconductor components 10, 20 and the envisaged joining location 5a as well as the baseplate 8 are spaced apart from the inductor 50 in the direction n of the normal.

The temperature of the baseplate 8 may be monitored by using a temperature sensor 52a in thermal contact therewith and may be regulated as necessary by the intensity and/or the duration and/or the frequency of the current flowing through the inductor 50, with the result that a predetermined temperature profile with very short heating-up times may be followed even in the case of high-mass material to be soldered having a high thermal capacity.

Figure 6:
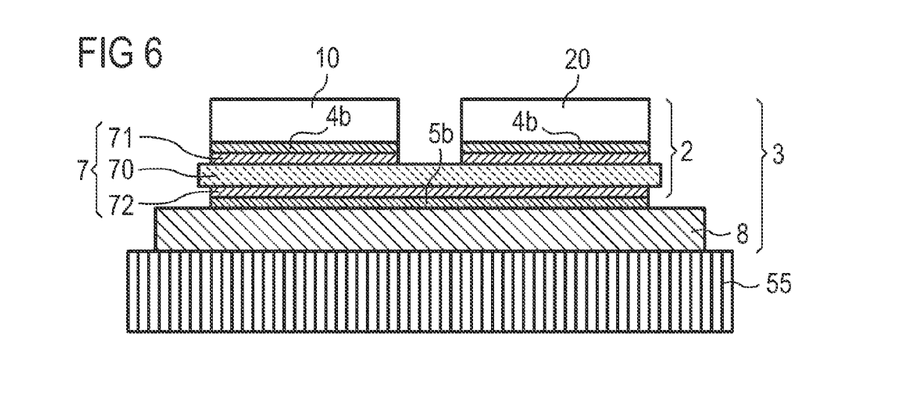

After the solder 5a has been heated up and liquefied, the baseplate 8 with the populated substrate 2 situated thereon is placed onto a cooling plate 55 in accordance with FIG. 6, with the result that the liquefied solder 5a is cooled and a solidified solder layer 5b arises.

Instead of or in addition to the temperature sensor 52a in accordance with FIGS. 2 and 5, it is possible to provide as many further temperature sensors 52b, 52c, 52d as desired which are in thermal contact with one or more of the soldering partners at least during the heating-up of the intermediate plate 51, in order to thermally monitor e.g., temperature-sensitive regions and/or elements of the soldering partners.

Thus, in accordance with FIGS. 2 and 5, the temperature sensors 52b, 52c serve for monitoring the temperatures of the power semiconductor components 10b and 20, respectively, and the temperature sensor 52d serves for monitoring the temperature of the substrate 7.

Figure 7:
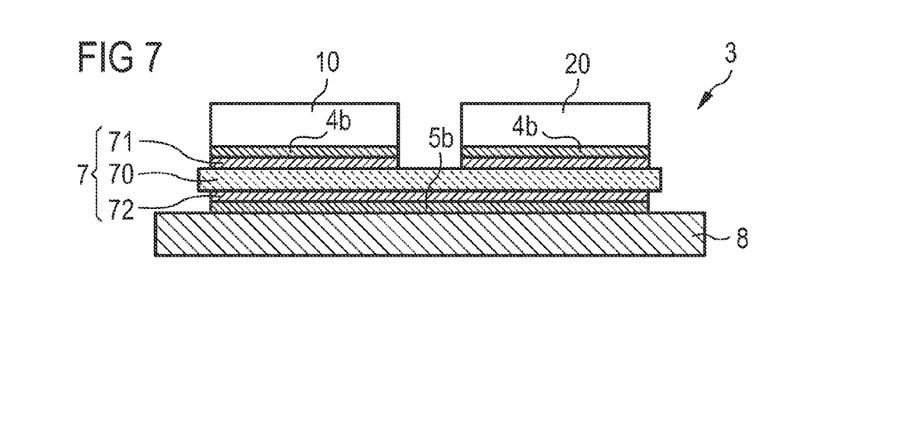

After lift-off from the cooling plate 55, a populated baseplate 3 is present, as illustrated in FIG. 7.

As an alternative to the described successive production of the soldering connections 4b and 5b in accordance with FIG. 1, the soldering connections 4b and 5b may also be produced in the same soldering process. In this case, the baseplate 8 may be used as intermediate plate.

Figure 8:
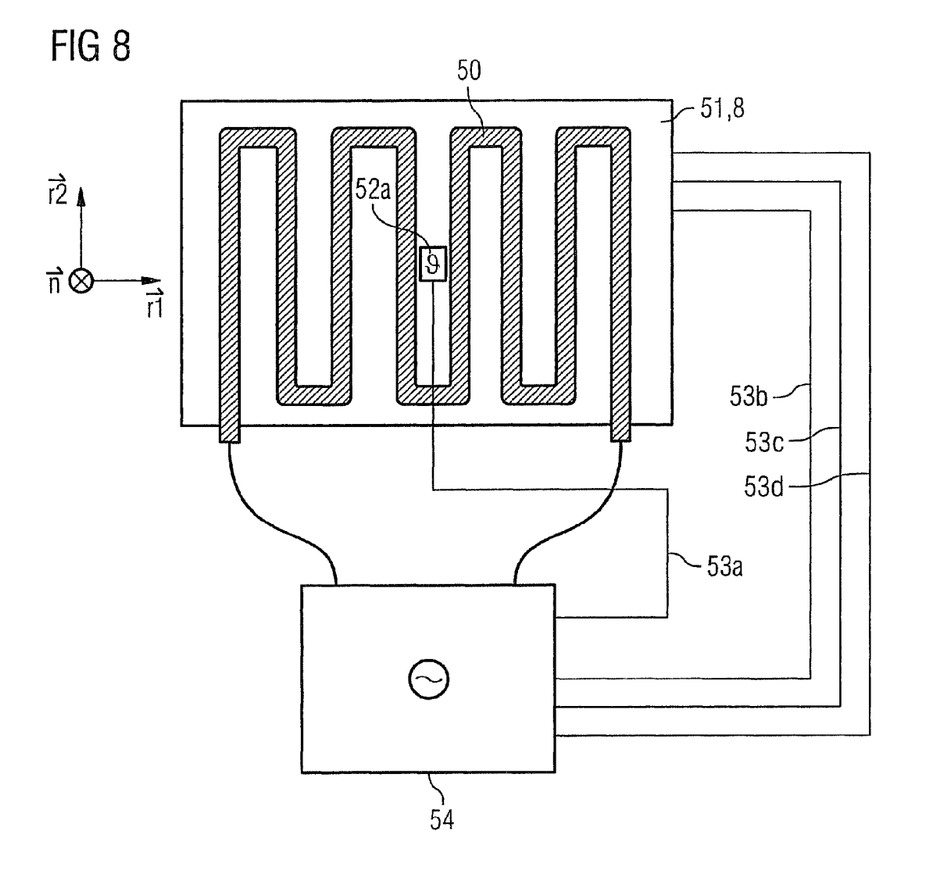
FIG. 8 illustrates a view of the arrangement in accordance with FIG. 2 or 5 from the underside.

FIG. 8 illustrates an arrangement in accordance with FIGS. 2 and 5 from below. The view illustrates the intermediate plate 51 in accordance with FIG. 2 or the baseplate 8 in accordance with FIG. 5, in each case with inductor 50 lying before it. The temperature sensor 52*a* is connected to a generator 54 by using a connecting line 52*a*. The temperature sensors 52*b*, 52*c* and 52*d*—not discernible in FIG. 8—in accordance with FIGS. 2 and 5 are likewise connected to the generator 54 by using connecting lines 53*b*, 53*c* and 53*d*.

In order to heat the intermediate plate 51 or the baseplate 8, the generator 54 feeds an AC current to the inductor 50. By using the temperature sensors 52*a*, 52*b*, 52*c* and 52*d*, the temperatures and also temperature changes at relevant locations of the soldering partners may be monitored by the generator 54.

If the temperature measured by one or more of the temperature sensors 52*a*, 52*b*, 52*c*, 52*d* reaches or exceeds a respectively predetermined temperature limit value or if a temperature change measured by one or more of the temperature sensors 52*a*, 52*b*, 52*c*, 52*d* permits the conclusion to be drawn that a respectively predetermined temperature limit value will imminently be reached or exceeded, then the power transmitted to the intermediate plate 51, 8 by the inductor 50 may be reduced by a reduction of the intensity and/or an adaptation of the frequency or by a switching-off of the current provided by the generator 54. In this way it is possible to follow a predetermined temperature profile in which the soldering partners involved are protected against thermal overloading.

The heating-up of the solder 4*a* and 5*a* described with reference to FIGS. 2 and 5 may be performed in an evacuatable chamber in order to avoid oxidation in the region of the joining location to be produced and also the formation of gas inclusions in the liquid solder.

Figure 9:
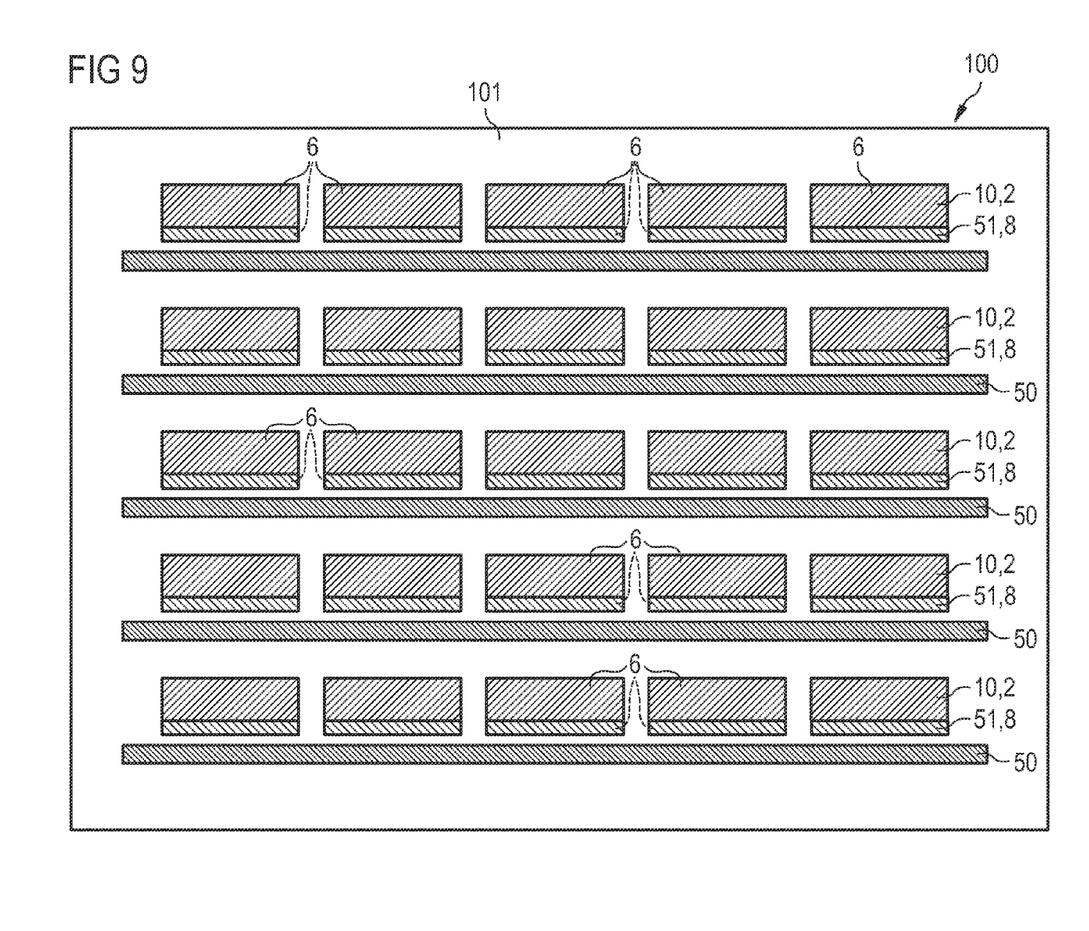
FIG. 9 illustrates a cross section through a soldering furnace for the batchwise production of soldering connections.

FIG. 9 illustrates a soldering furnace 100 ("batch soldering furnace") with an evacuatable chamber 101. A number of planes lying one above another and each having an inductor 50 are provided in the evacuatable chamber 101 for the batch-wise production of soldering connections. Material 6 to be soldered is arranged above each of the inductors 50. The inductors 50 may be fixedly connected to the soldering furnace 100.

The material 6 to be soldered may be for example semiconductor components 10, 20 and substrates 7 in accordance with FIG. 2. In this case, an intermediate plate 51 independent of the material to be soldered is arranged between each inductor 50, on the one hand, and the associated semiconductor components 10, 20 and substrates 7, on the other hand.

In one embodiment, however, the material to be soldered may also be populated substrates 2 and baseplates 8 to be soldered thereto in accordance with FIG. 5. In this case, the intermediate plates 51 are formed by the baseplates 8 which are a constituent part of the material 6 to be soldered, which is indicated in FIG. 9 by the dashed lines at the reference symbol 6 of the material to be soldered.

The soldering connections are produced in the evacuatable soldering furnace 100 in the manner described with reference to FIGS. 1 to 8, the soldering furnace 100 being evacuated before the switching-on or during the switching-on of the inductors 50.

The undesired heating of a power semiconductor component 10 of a power semiconductor module to be produced by an inductor 50 associated with the overlying plane may be avoided by using distances that are chosen to be sufficiently large, or by using intervening shielding plates.

One or more temperature sensors may be provided for each plane, the temperature sensors—as illustrated in FIGS. 2 and 5—being in thermal contact with predetermined locations of the material 6 to be soldered.

In this way, the inductors 50 of the various planes may be driven individually in temperature-dependent fashion, as has been explained on the basis of the examples in accordance with FIGS. 1 to 8.

In the embodiment in accordance with FIG. 9, the illustration of the temperature sensors and of the generator and of the associated connecting lines has been dispensed with for reasons of clarity.

For cooling purposes, the material 6 to be soldered may be placed onto the respective inductors 50—optionally with the inductors 50 switched off—and be cooled using the liquid cooling of the inductors.

Figure 10:
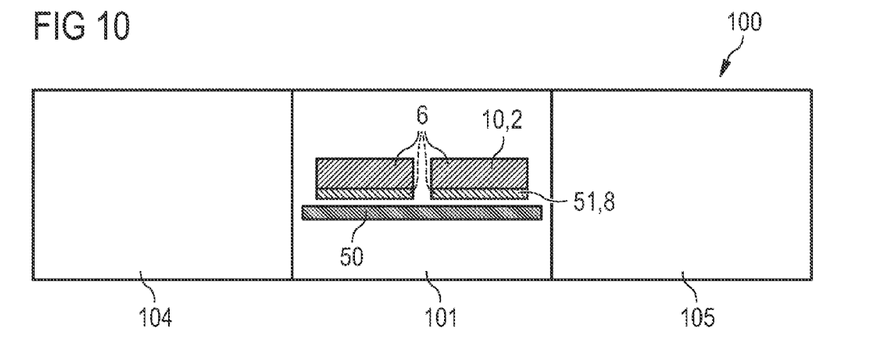
FIG. 10 illustrates a vertical section through a soldering furnace with a soldering chamber and also an inlet lock and an outlet lock.

FIG. 10 illustrates a soldering furnace 100 with a soldering chamber 101 arranged between an inlet lock 104 and an outlet lock 105.

At the beginning, the material 6 to be soldered is firstly introduced into the inlet lock 104. The inlet lock 104 is then flooded with a protective gas, e.g., nitrogen or a forming gas, after single or repeated previous evacuation with a protective gas to a predetermined pressure. The transport from one chamber into the subsequent chamber may be effected at atmospheric pressure, but may also take place under a vacuum. In the heating chamber 101, the heating may take place in the manner described in FIG. 9.

Finally, the material 6 to be soldered is brought into the—optionally evacuated and flooded—outlet chamber 105 for cooling purposes. After the outlet chamber has been flooded with a protective gas, e.g., nitrogen or a forming gas, the completed material 6 to be soldered may be removed from the outlet chamber 105.

Figure 11:
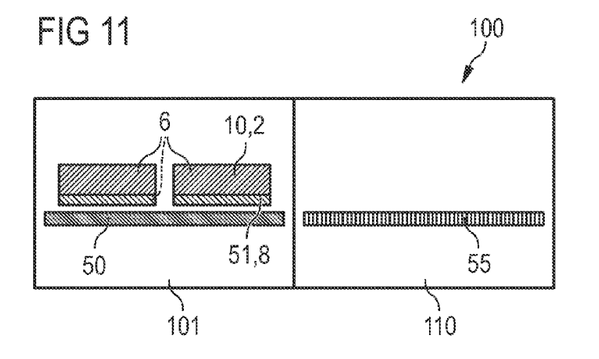
FIGS. 11 and 12 illustrate two processes of a method for producing a soldering connection in a two-chamber soldering furnace having a heating chamber and a cooling chamber.
Figure 12:
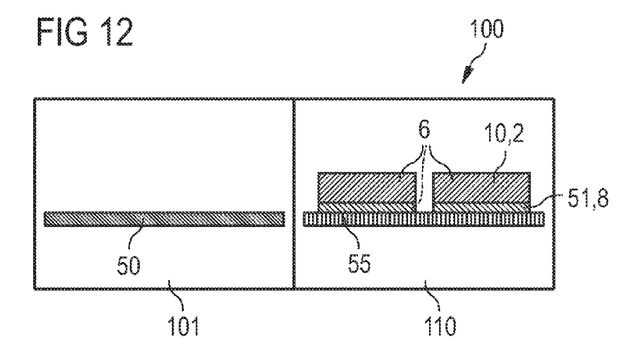

FIGS. 11 and 12 illustrate a two-chamber soldering furnace 100 with a heating chamber 101 and a cooling chamber 110, but without inlet and outlet locks.

As can be seen from FIG. 11, at the beginning the material 6 to be soldered is introduced into the heating chamber 101. After gas exchange, i.e. after single or repeated evacuation and flooding of the heating chamber 101 with a protective gas, in which case a predetermined pressure of e.g., 0 hPa-800 hPa, e.g., less than or equal to 10 hPa, or e.g., less than or equal to 1 hPa, is optionally set during the final flooding or evacuation, the soldering partners 6 and the solder required for connecting them are heated-up until the solder liquefies, as described above, using one or more inductors 50 and also one or more intermediate plates 51, 8. The heating-up may take place at a defined pressure of e.g., 0 hPa-800 hPa, e.g., less than or equal to 10 hPa, or e.g., less than or equal to 1 hPa, or at atmospheric pressure.

For cooling purposes, after gas exchange, the material 6 to be soldered is brought into the cooling chamber 110, which is evacuated or, if appropriate, flooded with a protective gas to a defined pressure, and the material 6 to be soldered is thermally contact-connected to a cooling plate 55, which can be seen from FIG. 12. The cooling plate 55 may be cooled by the cooling (not illustrated) of the inductor 50.

FIGS. 13 to 18 illustrate various processes in the production of a soldering connection between two soldering partners in a multi-chamber soldering furnace 100 having an arbitrary number N of successively arranged heating chambers 101, 102, 103, . . . N and, finally, a cooling chamber 110. The first heating chamber 101 simultaneously constitutes an inlet lock 104, and the cooling chamber 110 simultaneously constitutes an outlet lock 105. The individual chambers 101, 102, 103, ... N, 110 are separated from one another by locks in gastight and pressure-independent fashion.

One or more inductors 50 are situated in each of the heating chambers 101, 102, 103, ... N, the inductors being fixedly connected to the respective heating chamber 101, 102, 103, ... N. The cooling chamber 110 has one or more cooling plates 55 fixedly connected to the cooling chamber.

Figure 13:
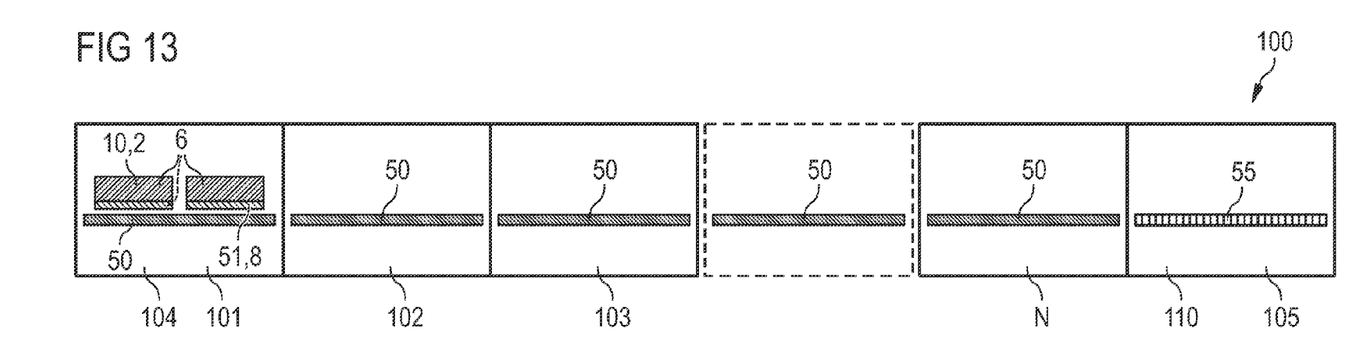
FIGS. 13 to 18 illustrate several processes for producing a soldering connection in a multi-chamber continuous soldering furnace having a number of successively arranged heating chambers and finally a cooling chamber.
Figure 14:
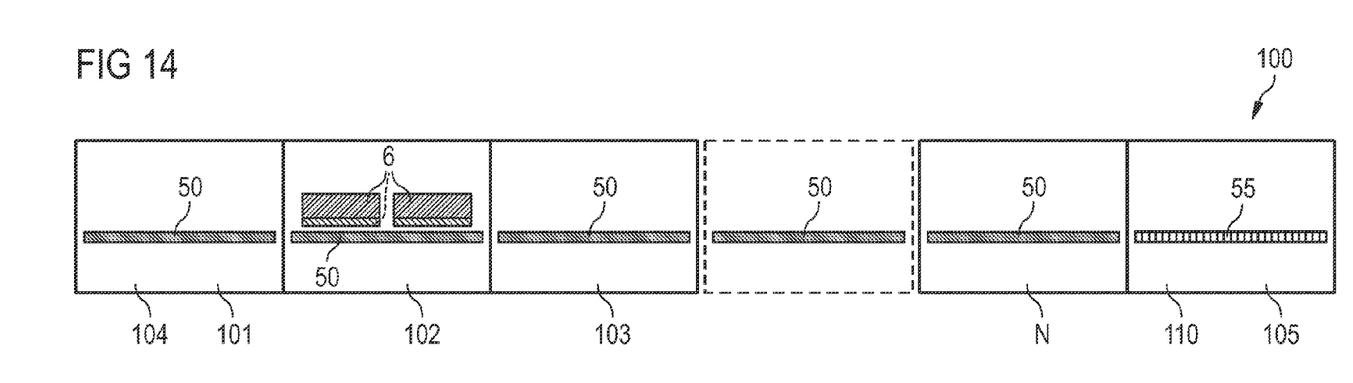
Figure 15:
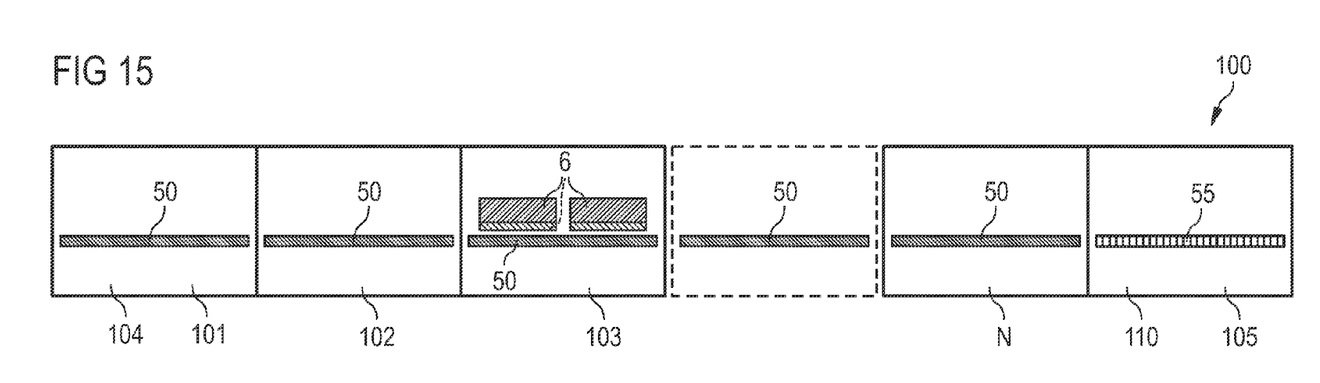
Figure 16:
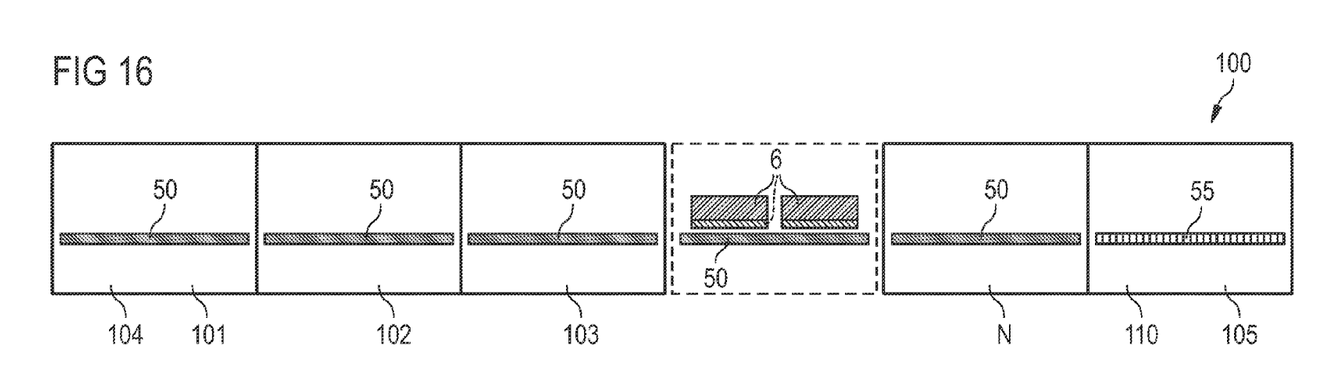
Figure 17:
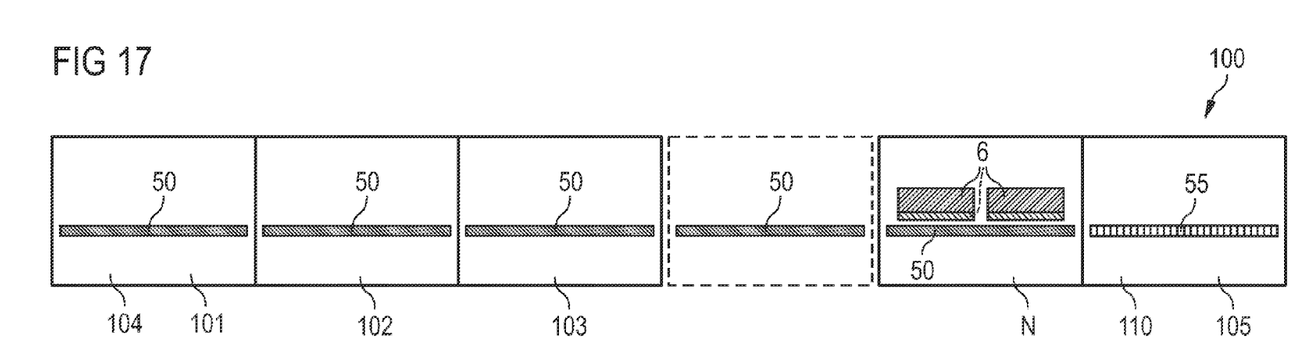
Figure 18:
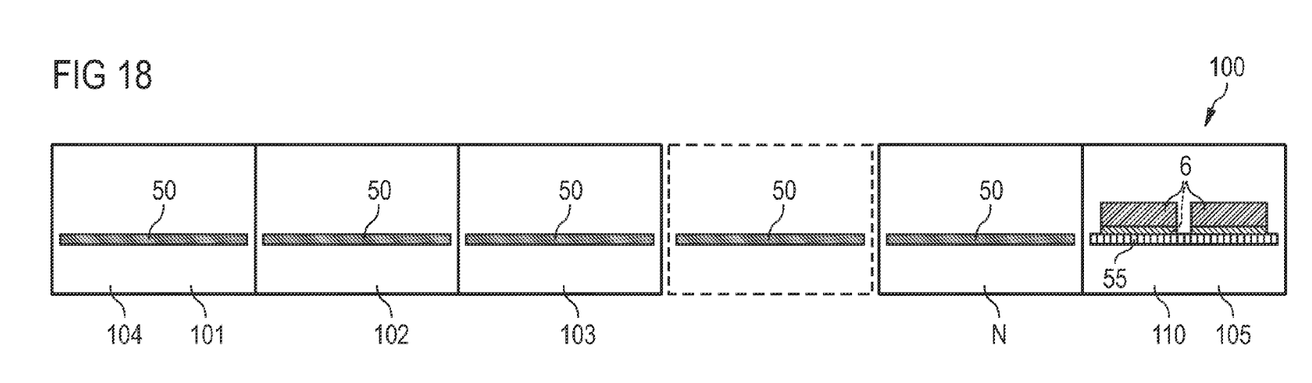

As is illustrated in FIG. 13, the material 6 to be soldered is introduced into the first heating chamber 101 at the beginning of the soldering process.

After gas exchange, i.e. after single or repeated evacuation and flooding of the heating chamber 101 with a protective gas, in which case a predetermined pressure of e.g., 0 hPa-800 hPa, e.g., less than or equal to 10 hPa, or e.g., less than or equal to 1 hPa, is optionally set during the final flooding or evacuation, the inductors 50 of the first heating chamber 101 are activated and the material 6 to be soldered is brought to a predetermined temperature via the intermediate plate 51.

Afterward, the material 6 to be soldered successively passes through the heating chambers 102, 103, ... N, which have in each case been previously evacuated and, if appropriate, flooded with protective gas to a defined pressure, the inductors 50 of each of the heating chambers 102, 103, ... N being driven in such a way that the material 6 to be soldered is brought to a temperature predetermined for the respective chamber.

In this way, by using a suitable driving of the inductors 50 of the heating chambers 101, 102, 103, ... N and also by using a suitable driving of the throughput speed of the material 6 to be soldered through the heating chambers 101, 102, 103, ... N, it is possible to set a specific temperature profile undergone by the material 6 to be soldered.

After the solder used for soldering has been heated up and liquefied, the material 6 to be soldered is introduced into the cooling chamber 110 and cooled. For this purpose, the material 6 to be soldered is thermally contact-connected to a cooling plate 55, which is illustrated as the result in FIG. 18. The cooling plate 55 may be cooled e.g., by a liquid cooling by which the inductors 50 are also cooled.

Figure 19:
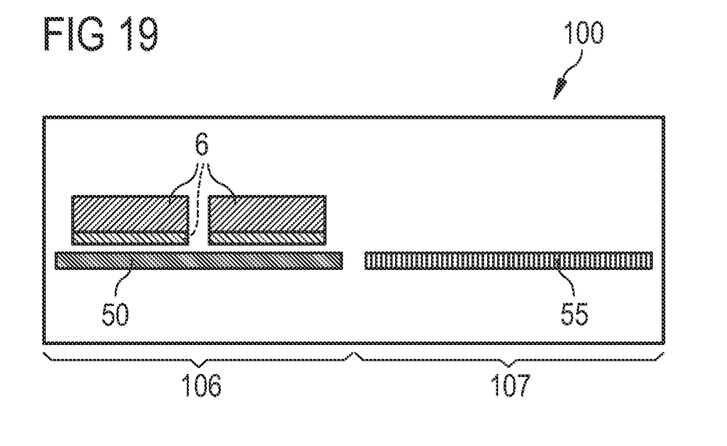
FIGS. 19 and 20 illustrate two processes of a method for producing a soldering connection in a zone soldering furnace with a chamber having a heating zone and a cooling zone.
Figure 20:
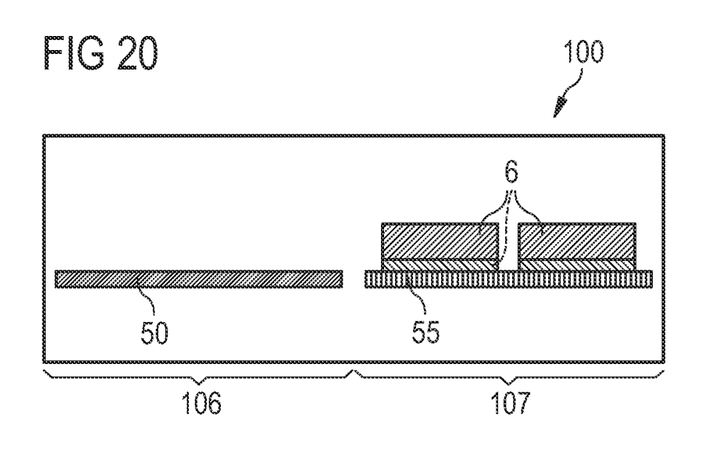

FIGS. 19 and 20 illustrate a soldering furnace 100 formed as a zone soldering furnace and having a heating zone 106 and a cooling zone 107. The gas exchange is effected for both zones 106, 107 before the beginning of the soldering process by using single or repeated evacuation and flooding of the zones 106, 107 with a protective gas, in which case a predetermined pressure of e.g., 0 hPa-800 hPa, e.g., less than or equal to 10 hPa, or e.g., less than or equal to 1 hPa, is optionally set during the final flooding or evacuation.

An inlet lock and an outlet lock for the exchange of protective gas are not present, but may optionally be provided.

One or more inductors 50 that may be fixedly connected to the soldering furnace 100 are situated in the region of the heating zone 106, and one or more cooling plates 55 that may be fixedly connected to the soldering furnace 100 are situated in the cooling zone 107.

In order to produce the soldering connections, the material 6 to be soldered is positioned above the at least one inductor 50 and the soldering furnace 100 is evacuated.

After the melting of the solder required for producing the soldering connections of the material 6 to be soldered in the heating zone 106, the material 6 to be soldered is introduced into the cooling zone 107 and placed onto the one or more cooling plates 55 and thereby cooled, which is illustrated as the result in FIG. 20.

In all of the preceding examples, the soldering operation is effected, e.g., with regard to the arrangement of the soldering partners, the joining locations, the semiconductor components, the inductors and intermediate plates, e.g., in the manner described with reference to FIGS. 1 to 8.

After the evacuation of the heating, inlet, outlet and cooling chambers, the absolute pressure in the relevant chambers is e.g., less than 1 hPa.

For example, in the cases in which an intermediate plate independent of the material to be soldered is used for soldering, a plurality of assemblies to be soldered may also share a common intermediate plate.

Figure 21:
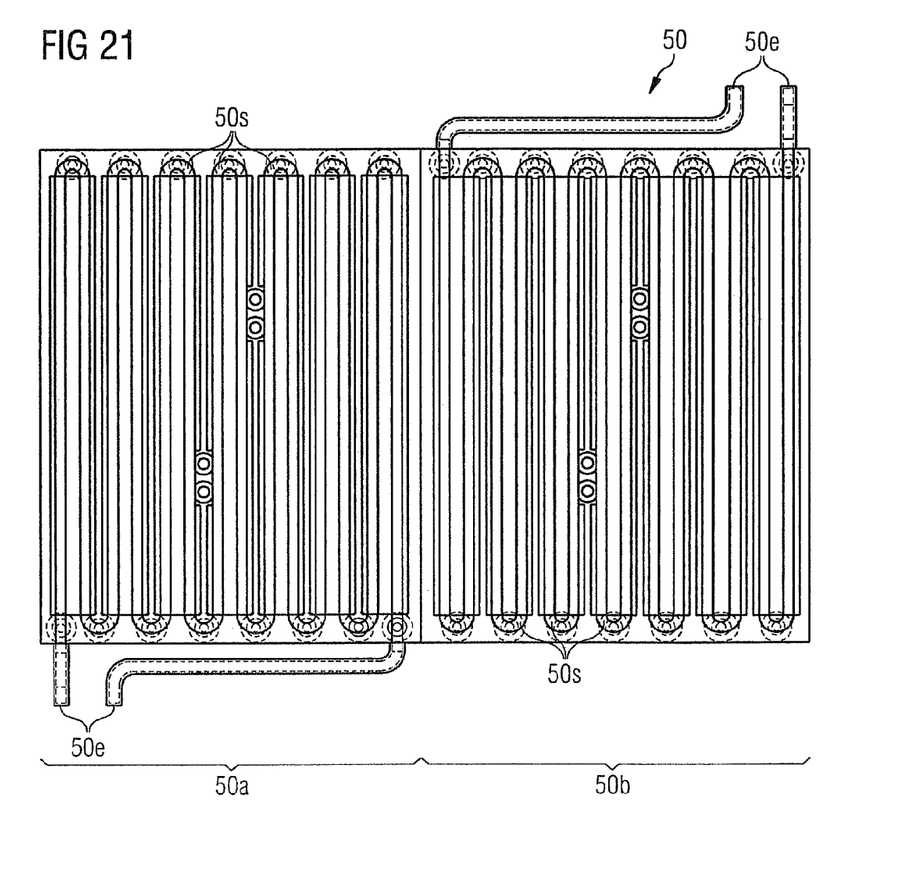
FIG. 21 illustrates a plan view of an inductor suitable for use in a method in accordance with one of the preceding figures.

FIG. 21 illustrates a plan view of an inductor 50 such as is suitable for application in a method according to the invention.

The inductor includes two identical partial inductors 50a and 50b each having a number of inductor loops 50s. The inductor loops 50s of each partial inductor 50a, 50b are formed as electrically conductive tubes connected in series. Any desired cooling liquid, for example water, may be passed through the inductor tubes and the inductor can thereby be cooled.

Apart from the ends 50e of the partial inductors, which simultaneously constitute the electrical connections and also the connections for feeding the cooling liquid, the inductor 50 is formed essentially in planar fashion.

Figure 22:
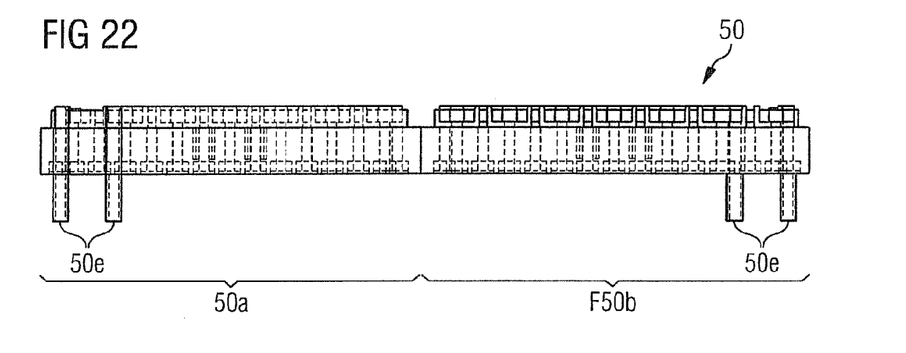
FIG. 22 illustrates a first side view of the inductor in accordance with FIG. 21.
Figure 23:
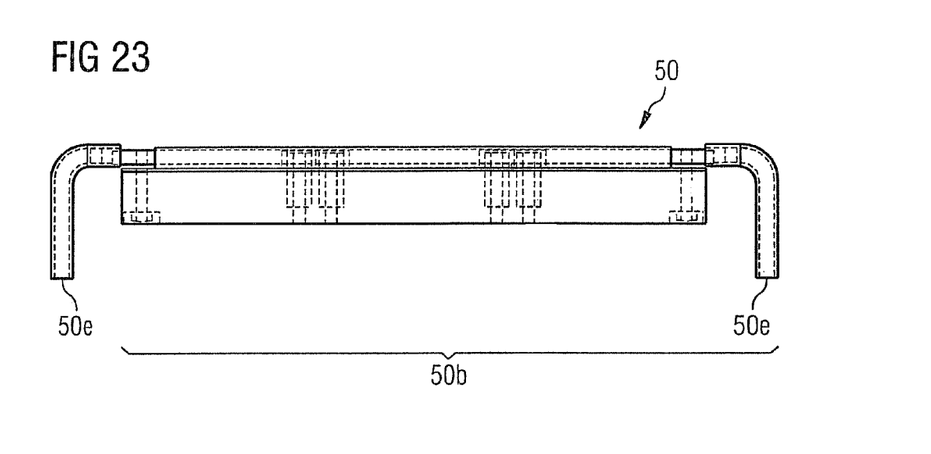
FIG. 23 illustrates a second side view of the inductor in accordance with FIG. 21.
Figure 24:
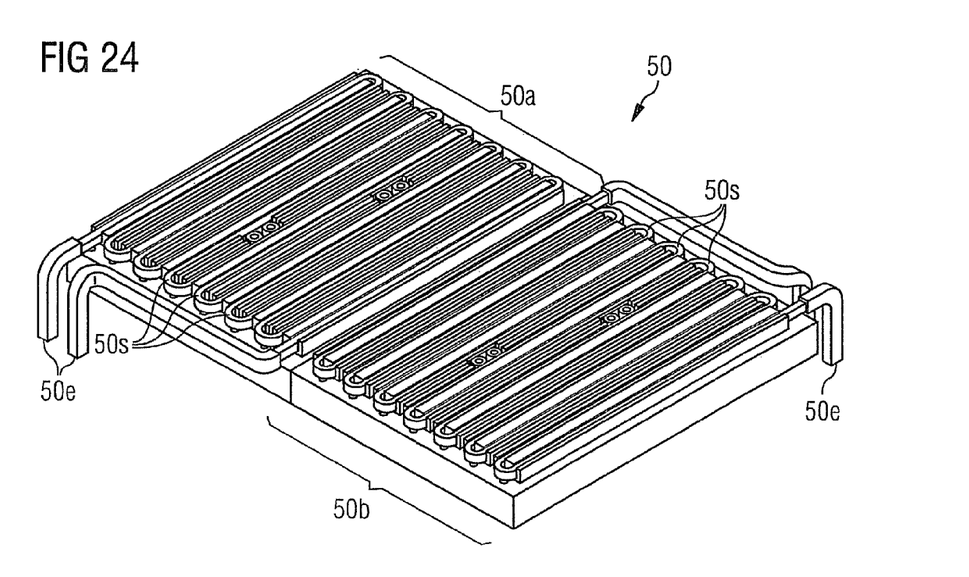
FIG. 24 illustrates a perspective view of the inductor in accordance with FIG. 21.

FIGS. 22 and 23 also illustrate different side views, and FIG. 24 illustrates a plan view of the inductor in accordance with FIG. 21.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an electronic device comprising: providing two soldering partners which are to be directly connected to one another at an envisaged joining location and at least one of which comprises an electronic component or is formed as such a component; providing a soldering apparatus having an inductor; providing an intermediate plate comprising a metal plate for the generation of eddy currents therein; positioning the soldering partners, the inductor and the intermediate plate in such a way that the intermediate plate is arranged between the envisaged joining location and the inductor, and the envisaged joining location is between the intermediate plate and the electronic component; connecting the soldering partners at the envisaged joining location by using a solder that is melted by energy emitted by the inductor; feeding electric current generated by a generator to the inductor which generates the eddy currents in the intermediate plate that produce heat which melts the solder; thermally coupling at least one temperature sensor to at least one of the intermediate plate and at least one of the soldering partners; and controlling one of the intensity, the frequency, and the intensity and the frequency of the electric current in a manner dependent on the temperature determined using the at least one temperature sensor.

2. The method of claim 1, comprising arranging the inductor in one plane and spacing the envisaged joining location apart from the inductor in a direction of a normal to the plane.

3. The method of claim 2, comprising projecting the intermediate plate beyond the electronic component in each lateral direction perpendicular to the direction of the normal to the plane.

4. The method of claim 1, comprising wherein the intermediate plate constitutes one of the soldering partners or is a constituent part of one of the soldering partners.

5. The method of claim 4, comprising wherein the intermediate plate is the baseplate of a power semiconductor module to be produced.

6. The method of claim 1, comprising wherein one soldering partner is a ceramic carrier provided with a metallization layer.

7. The method of claim 6, comprising wherein the other soldering partner is a power semiconductor component.

8. The method of claim 1, comprising wherein the soldering partners are parts of a power semiconductor module to be produced.

9. The method of claim 1, comprising arranging the soldering partners and the joining location in an evacuatable chamber.

10. The method of claim 9, comprising melting the solder in the chamber at an absolute pressure of less than or equal to 800 hPa.

11. The method of claim 1, comprising wherein there is a uniform heat transfer resistance during the melting of the solder between the intermediate plate and at least one of the soldering partners.

12. The method of claim 1, including cooling the inductor using a liquid.

13. A method for producing an integrated circuit device comprising:
    providing two soldering partners which are to be connected to one another at an envisaged joining location, at least one of which comprises an electronic component;
    providing a soldering apparatus having an inductor;
    providing an intermediate plate comprising a metal plate for the generation of eddy currents therein;
    positioning the soldering partners, the inductor and the intermediate plate such that the intermediate plate is arranged between the envisaged joining location and the inductor, and the envisaged joining location is between the electronic component and the intermediate plate; and
    directly connecting the soldering partners to one another at the envisaged joining location using a solder melted by energy emitted by the inductor, including:
        feeding electric current generated by a generator to the inductor which generates the eddy currents in the intermediate plate that produce heat which melts the solder;
        thermally coupling at least one temperature sensor to at least one of the intermediate plate and at least one of the soldering partners; and
        controlling one of the intensity, the frequency, and the intensity and the frequency of the electric current in a manner dependent on the temperature determined using the at least one temperature sensor.

14. The method of claim 13, comprising arranging the inductor in one plane and spacing the envisaged joining location apart from the inductor in a direction of a normal to the plane.

15. The method of claim 14, comprising projecting the intermediate plate beyond the electronic component in each lateral direction perpendicular to the direction of the normal to the plane.

16. The method of claim 13, comprising wherein the intermediate plate is the baseplate of a power semiconductor module to be produced.

17. The method of claim 13, comprising wherein one soldering partner is a ceramic carrier provided with a metallization layer.

18. The method of claim 17, comprising wherein the other soldering partner is a power semiconductor component.

19. A system configured to produce an integrated circuit device comprising:
    two soldering partners to be connected to one another at an envisaged joining location, at least one of which comprises an electronic component;
    a soldering apparatus having an inductor;
    a generator feeding electric current to the inductor;
    an intermediate plate comprising a metal plate for the generation of eddy currents therein, where the soldering partners, the inductor and the intermediate plate are configured such that the intermediate plate is arranged between the envisaged joining location and the inductor, and the envisaged joining location is between the intermediate plate and the electronic component;
    at least one temperature sensor thermally coupled to at least one of the intermediate plate and at least one of the soldering partners; and
    wherein the soldering partners are connected at the envisaged joining location using a solder melted by energy emitted by the inductor, the inductor generating the eddy currents in the intermediate plate that produce heat which melts the solder, and wherein at least one of an intensity and a frequency of the electric current is based on the temperature as determined by the at least one temperature sensor.

20. The system of claim 19, comprising where the inductor is arranged in one plane and the envisaged joining location is spaced apart from the inductor in a direction of a normal to the plane.

21. The system of claim 20, comprising where the intermediate plate is projected beyond the electronic component in each lateral direction perpendicular to the direction of the normal to the plane.

22. The system of claim 19, comprising wherein the intermediate plate is a baseplate of a power semiconductor module.

23. The system of claim 19, comprising wherein one soldering partner is a ceramic carrier provided with a metallization layer.

24. The system of claim 23, comprising wherein one other soldering partner is a power semiconductor component.

* * * * *